(12) United States Patent
Seki et al.

(10) Patent No.: US 10,119,199 B2
(45) Date of Patent: Nov. 6, 2018

(54) METHOD FOR PRODUCING SIC SINGLE CRYSTAL

(71) Applicant: TOYOTA JIDOSHA KABUSHIKI KAISHA, Aichi (JP)

(72) Inventors: Kazuaki Seki, Futtsu (JP); Kazuhito Kamei, Osaka (JP); Kazuhiko Kusunoki, Nishinomiya (JP); Katsunori Danno, Susono (JP); Hironori Daikoku, Susono (JP); Masayoshi Doi, Nagoya (JP)

(73) Assignee: TOYOTA JIDOSHA KABUSHIKI KAISHA, Aichi (JP)

( * ) Notice: Subject to any disclaimer, the term of this patent is extended or adjusted under 35 U.S.C. 154(b) by 0 days.

(21) Appl. No.: 15/558,683

(22) PCT Filed: Mar. 17, 2016

(86) PCT No.: PCT/JP2016/001573
§ 371 (c)(1),
(2) Date: Sep. 15, 2017

(87) PCT Pub. No.: WO2016/147673
PCT Pub. Date: Sep. 22, 2016

(65) Prior Publication Data
US 2018/0112328 A1  Apr. 26, 2018

(30) Foreign Application Priority Data
Mar. 18, 2015 (JP) .................................. 2015-055454

(51) Int. Cl.
| C30B 25/20 | (2006.01) |
| C30B 19/10 | (2006.01) |
| C30B 29/36 | (2006.01) |
| C30B 23/02 | (2006.01) |
| C30B 29/68 | (2006.01) |

(52) U.S. Cl.
CPC ............ C30B 19/10 (2013.01); C30B 23/025 (2013.01); C30B 25/20 (2013.01); C30B 29/36 (2013.01); C30B 29/68 (2013.01)

(58) Field of Classification Search
CPC ....... C30B 19/10; C30B 29/36; C30B 23/025; C30B 25/20
See application file for complete search history.

(56) References Cited

U.S. PATENT DOCUMENTS

2013/0042802 A1* 2/2013 Danno .................... C30B 15/14
117/60

FOREIGN PATENT DOCUMENTS

| JP | 2009-091222 | 4/2009 |
| JP | 2014-122133 | 7/2014 |
| WO | 2013/065204 | 5/2013 |

* cited by examiner

*Primary Examiner* — Robert M Kunemund
(74) *Attorney, Agent, or Firm* — Clark & Brody

(57) ABSTRACT

A production method according an embodiment of the present invention is to produce a SiC single crystal by a solution growth technique, and includes a formation step and a growth step. In the formation step, material of Si—C solution contained in a crucible is melted, and a Si—C solution is formed. In the growth step, a SiC seed crystal attached to a bottom end of a seed shaft is brought into contact with the Si—C solution, and a SiC single crystal is grown on a crystal growth surface of the SiC seed crystal. In the growth step, while a temperature of the Si—C solution is being raised, the SiC single crystal is grown. The SiC single crystal production method according to the embodiment facilitates production of a SiC single crystal of a desired polytype.

12 Claims, 4 Drawing Sheets

METHOD FOR PRODUCING SIC SINGLE CRYSTAL

TECHNICAL FIELD

The present invention relates to a method for producing a single crystal and more particularly to a method for producing a SiC single crystal.

BACKGROUND ART

Silicon carbide (SiC) is a thermally and chemically stable compound. SiC is excellent in bandgap, breakdown voltage, electron saturation velocity and thermal conductivity as compared with silicon (Si). Therefore, SiC is expected to be used as a next-generation semiconductor material.

SiC is known as a material that occurs in many different crystal structures. The crystal structures of SiC include hexagonal polytypes 6H and 4H, a cubic polytype 3C and others. A SiC single crystal having a crystal structure of 4H (which will hereinafter be referred to as a 4H—SiC single crystal) has a wide band gap as compared with SiC single crystals having other crystal structures. Therefore, a 4H—SiC single crystal is attracting attention as a material for next-generation power devices.

As a way of producing a SiC single crystal, a solution growth technique is known. According to the solution growth technique, a crystal growth surface of a seed crystal, which is a SiC single crystal, is caused to contact a Si—C solution. The portion of the Si—C solution in vicinity to the seed crystal is put into a supercooled state, whereby a SiC single crystal grows on the seed crystal.

Regarding growth of a 4H—SiC single crystal, a spiral growth process is known as a way of causing the growing crystal to inherit the polytype of the seed crystal. In the spiral growth process, a crystal is grown while information of a stacking sequence is transmitted to the crystal growth surface by use of screw dislocations existing in the seed crystal.

During bulk growth of a 4H—SiC single crystal, it often occurs that polytypes other than the polytype 4H are mixed in the growing crystal. This results in the production of a SiC crystal partly including polycrystals (defects). Thus, stable growth of a 4H—SiC single crystal is difficult.

There are two approaches to stable growth of a 4H—SiC single crystal. One is causing the growing single crystal to inherit the polytype of the seed crystal (that is, the polytype 4H), and the other is performing nucleation of 4H—SiC. In the latter approach, it is difficult to control the polytype. In the former approach, the polytype (4H) of the seed crystal is not always inherited to the growing single crystal successfully. A failure in inheriting the polytype of the seed crystal to the growing crystal results in mixing of different polytypes (6H and/or other polytypes) other than 4H—SiC in the growing crystal, which makes it difficult to grow a 4H—SiC bulk single crystal.

Japanese Patent Application Publication No. 2009-91222 (Patent Literature 1), International Patent Application Publication No. 2013/065204 (Patent Literature 2) and Japanese Patent Application Publication No. 2014-122133 (Patent Literature 3) disclose SiC single crystal production methods that inhibit defects in SiC single crystals.

In the production method disclosed in Patent Literature 1, a SiC seed crystal having a crystal growth surface inclined from the {0001} plane is immersed in a Si—C solution, and a SiC single crystal is grown on the seed crystal. According to Patent Literature 1, this inhibits three-dimensional growth of the SiC single crystal and promotes stable and high-grade two-dimensional growth.

In the production method disclosed in Patent Literature 2, the degree of C supersaturation in the SiC solution in the region in vicinity to the crystal growth surface of the SiC seed crystal is controlled. Specifically, a high C supersaturation period and a low C supersaturation period are repeated alternately. According to Patent Literature 2, in this way, a SiC single crystal having an even crystal growth surface can be produced at a high growth rate.

In the production method disclosed in Patent Literature 3, in the middle of growth of a SiC single crystal, the crystal growth surface is separated from the Si—C solution to stop the crystal growth. After the stop of the crystal growth, the temperature of the Si—C solution is raised. After the temperature rise of the Si—C solution, which leads to maintenance of a constant temperature of the Si—C solution, the discontinued growth of the SiC single crystal is restarted. According to Patent Literature 3, the C concentration in the Si—C solution is regulated in this way, which leads to inhibition of changes and transitions of the polytype.

CITATION LIST

Non-Patent Literature

[Patent Literature 1] Japanese Patent Application Publication No. 2009-91222

[Patent Literature 2] International Patent Application Publication No. 20131065204

[Patent Literature 3] Japanese Patent Application Publication No. 2014-122133

SUMMARY OF INVENTION

Technical Problems

However, Patent Literature 1 does not disclose any methods for maintaining a specified polytype of the SiC single crystal. In the production method disclosed in Patent literature 2, during the high C supersaturation period, other polytypes different from the polytype of the seed crystal may be formed on the crystal growth surface. In the production method disclosed in Patent Literature 3, the crystal growth temperature is maintained constant during crystal growth. In this case, there is still a possibility that other polytypes different from a desired polytype will be formed.

An object of the present invention is to provide a production method that facilitates growth of a SiC single crystal of a desired polytype.

Solution to Problems

A SiC single crystal production method according to an embodiment of the present invention employs a solution growth technique, and includes a formation step and a growth step. In the formation step, material contained in a crucible is melted, and a Si—C solution is formed. In the growth step, a SiC seed crystal attached to a bottom end of a seed shaft is brought into contact with the Si—C solution, and a SiC single crystal is grown on a crystal growth surface of the SiC seed crystal. In the growth step, while the temperature of the Si—C solution is being raised, the SiC single crystal is grown.

Advantageous Effects

A SiC single crystal production method according to the present invention facilitates growth of a SiC single crystal of a desired polytype.

DESCRIPTION OF EMBODIMENTS

Figure 1:
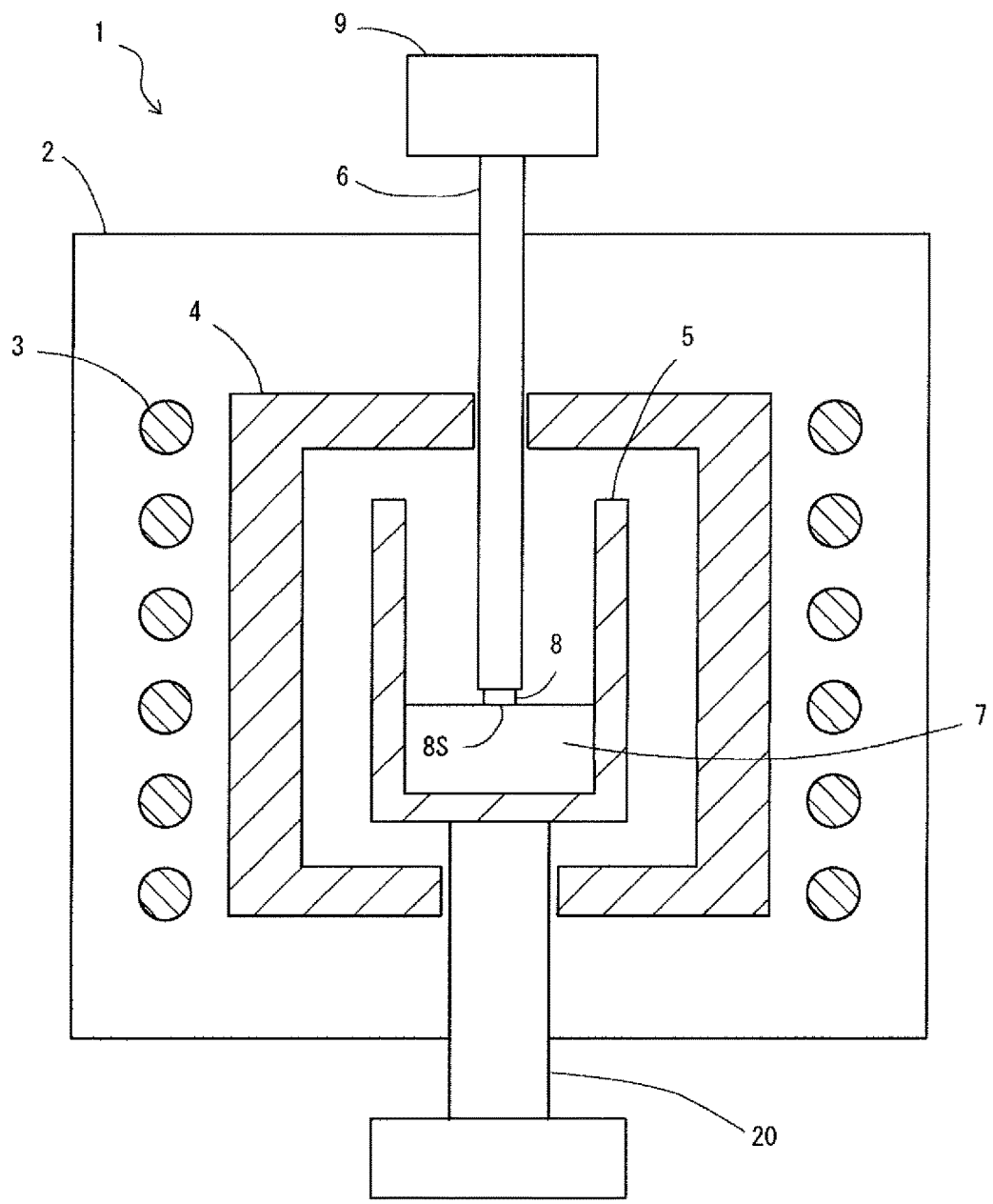
FIG. 1 is an overall view of a production apparatus for producing a SiC single crystal according to an embodiment.

A SiC single crystal production method according to an embodiment of the present invention employs a solution growth technique, and includes a formation step and a growth step. In the formation step, material in a crucible is melted, and a Si—C solution is formed. In the growth step, a SiC seed crystal attached to a seed shaft is brought into contact with the Si—C solution, and a SiC single crystal is grown on a crystal growth surface of the SiC seed crystal. In the growth step, while the temperature of the Si—C solution is being raised, the SiC single crystal is grown.

In the production method according to the present embodiment, during crystal growth, the temperature of the Si—C solution is being raised as time passes. In this case, the C solubility in the Si—C solution becomes higher during the crystal growth, and accordingly, the degree of C supersaturation in the Si—C solution can be inhibited from rising. Thereby, formation of different polytypes can be inhibited.

In the growth step, it is preferred that the crystal growth temperature at the end of growth of the SiC single crystal is higher than the crystal growth temperature at the start of growth.

It is preferred that a meniscus is formed between the liquid surface of the Si—C solution and the crystal growth surface of the SiC seed crystal.

This further inhibits formation of different polytypes during the crystal growth.

The height of the meniscus during the growth step is preferably 3 mm or less.

This inhibits crystal defects in the produced SiC single crystal. This also inhibits diameter reduction of the produced SiC single crystal.

A SiC single crystal production method according to another embodiment of the present invention employs a sublimation-recrystallization technique or a high-temperature CVD technique, and includes a preparation step and a growth step. In the preparation step, a SiC single crystal produced by the above-described method is prepared. In the growth step, with the prepared SiC single crystal used as a seed crystal, a SiC single crystal is grown on the crystal growth surface of the SiC seed crystal.

In this case, it is possible to produce a SiC single crystal at a high growth rate while inhibiting formation of other polytypes.

Embodiments of the present invention will hereinafter be described with reference to the drawings. In the drawings, the same or corresponding parts are provided with the same reference symbol, and the same description will not be repeated.

First Embodiment

[Production Apparatus]

FIG. 1 is an overall view of a production apparatus according to an embodiment of the present invention by the solution growth technique. As shown in FIG. 1, the production apparatus 1 includes a chamber 2, an induction heater 3, a heat insulator 4, a crucible 5, a seed shaft 6, a drive source 9, and a rotation device 20.

The induction heater 3 and the heat insulator 4 are placed in the chamber 2. Further, the crucible 5 can be placed in the chamber 2. When a SiC single crystal is produced, the chamber 2 is cooled.

The induction heater 3 is disposed around the crucible 5, and more specifically, is disposed around the heat insulator 4. The induction heater 3 is, for example, a high-frequency coil. The central axis of the coil of the induction heater 3 is directed in the vertical direction of the production apparatus 1. The coil of the induction heater 3 is preferably coaxial with the seed shaft 6.

The heat insulator 4 is like a case. The crucible 5 can be placed in the heat insulator 4. The heat insulator 4 keeps the crucible 5 placed therein warm. Through holes are made in the center of the upper lid and in the center of the bottom of the heat insulator 4. The seed shaft 6 passes through the through hole made in the upper lid. The rotation device 20 shaped like a shaft passes through the through hole made in the bottom.

The crucible 5 is a container with an upper open end, and a Si—C solution 7 is contained therein. The material of the crucible 5 preferably contains carbon. In this case, the crucible 5 serves as a carbon supply source to the Si—C solution 7. The crucible 5 is made of graphite, for example.

The seed shaft 6 is a rod-like shaft, and extends downward from the upper side of the chamber 2. The upper end of the seed shaft 6 is connected to the drive unit 9. The seed shaft 6 is inserted into the chamber 2 and the heat insulator 4. During crystal growth, the bottom end of the seed shaft 6 is located inside the crucible 5. A SiC seed crystal 8 is attachable to the bottom end of the seed shaft 6. When a SiC single crystal is to be produced, a seed crystal 8 is attached to the bottom end of the seed shaft 6. The drive source 9 is capable of moving up and down the seed shaft 6. Further, the drive source 9 is capable of rotating the seed shaft 6 around its axis.

The Si—C solution 7 is a material for the SiC single crystal, and contains silicon (Si) and carbon (C). The Si—C solution 7 may contain other metal elements in addition to Si and C. The Si—C solution 7 is produced by heating and melting of material for the Si—C solution 7.

The rotation device 20 is shaped like a shaft, and pierces through the bottom of the heat insulator 4 and the bottom of the chamber 2. The crucible 5 can be placed on the upper end of the rotation device 20. The rotation device 20 is capable of rotating the crucible 5 placed thereon around its central axis. Further, the rotation device 20 is capable of moving up and down the crucible 5.

[Production Method]

A production method according to the present embodiment includes a formation step and a growth step. In the formation step, a Si—C solution 7 is formed by use of the production apparatus 1. In the growth step, a SiC seed crystal 8 is brought into contact with the Si—C solution 7, and a SiC single crystal is grown while the temperature of the Si—C solution 7 is being raised. The steps will hereinafter be described.

[Formation Step]

The crucible 5, which contains material for the Si—C solution, is placed in the chamber 2, on the rotation device 20. Then, the chamber 2 is closed, and the chamber 2 is filled with an inert gas. The inert gas is, for example, helium or argon. The material in the crucible 5 is heated by the induction heater 3. The heated material melts, and the Si—C solution 7 is formed.

[Growth Step]

After the formation of the Si—C solution 7, the SiC seed crystal 8 is immersed in the Si—C solution 7. Specifically, the seed shaft 6 is moved down, and the SiC seed crystal 8 attached to the bottom end of the seed shaft 6 is brought into contact with the Si—C solution 7. When a 4H—SiC single crystal is to be produced, it is preferred that the crystal growth surface of the SiC seed crystal 8 is the (0001) plane, the (000-1) plane or a plane that is 8° or less off-axis from the (0001) or (000-1) plane. In such a case, a 4H—SiC single crystal is grown stably. In the following, a case of producing a 4H—SiC single crystal will be described. However, the production method according to the present embodiment is applicable to production of a SiC single crystal of any other polytype as well as 4H—SiC.

After the SiC seed crystal 8 is brought into contact with the Si—C solution 7, the induction heater 3 heats the Si—C solution 7 to a crystal growth temperature. The crystal growth temperature is the liquid surface temperature of the Si—C solution while a SiC single crystal is grown in the growth step. The crystal growth temperature is typically 1600 to 2200° C. In the growth step, a SiC single crystal is grown at such a crystal growth temperature.

Subsequently, the portion of the Si—C solution 7 in vicinity to the SiC seed crystal 8 (the portion hereinafter referred to simply as a vicinity portion) is supercooled. For example, a cooling medium is circulated in the seed shaft 6. The cooling medium is, for example, an inert gas such as argon, helium or the like. Thereby, the vicinity portion of the Si—C solution 7 is supersaturated with C. Accordingly, on the crystal growth surface 8S of the SiC seed crystal 8, a SiC single crystal is formed and grows.

In the growth step, further, in order to allow the growing SiC single crystal to inherit the polytype of the SiC seed crystal 8, the temperature of the Si—C solution 7 is being raised during the growth of the SiC single crystal. This prevents excessive supersaturation of C in the vicinity portion. Accordingly, this facilitates the inheritance of polytype from the SiC seed crystal 8 to the growing SiC single crystal. In this way, a SiC single crystal of the polytype 4H can be produced stably. This point will be discussed in more detail below.

[Maintenance of Polytype]

Regarding growth of a SiC single crystal, a spiral growth process is known as a way of maintaining a polytype. In the spiral growth process, a crystal is grown while information of a stacking sequence is transmitted to the crystal growth surface by use of screw dislocations existing in the seed crystal. Regarding growth of a 4H—SiC single crystal, it is possible to produce a 4H—SiC single crystal including other polytypes only in small quantity by keeping spiral growth on the entire crystal growth surface 8S.

In the growth step, C in the Si—C solution 7 is used for the growth of a SiC single crystal. Accordingly, it was thought that the C concentration lowers as time passes during a growth step. The present inventors, however, have found from their research that the C concentration in the Si—C solution 7 rises as time passes during a growth step.

The C concentration in the Si—C solution 7 rises as time passes during a growth step possibly for the following reason. During a growth step, usually, the crystal growth temperature is kept constant. As time passes, carbon is supplied from the crucible 7 to the Si—C solution 7. When the crystal growth temperature is constant, the solubility of C is constant. Accordingly, if C is continuously supplied to the Si—C solution 7 as time passes, the amount of C in the Si—C solution 7 will rise above the amount corresponding to the C solubility in the Si—C solution 7, and the Si—C solution 7 will be supersaturated with C. Alternatively, if the crucible 7 is not a supply source of C and if the material for the Si—C solution 7 contains C, the Si—C solution 7 will be evaporated as time passes. In this case also, the amount of C in the Si—C solution 7 will be likely to rise above the C solubility in the Si—C solution 7, and the Si—C solution 7 will be likely to be supersaturated with C.

When the degree of C supersaturation rises above a certain level, different polytypes are likely to be formed on the crystal growth surface 8S of the SiC seed crystal 8. If the different polytypes are epitaxially grown, it will block the spiral growth of 4H—SiC, thereby making it difficult to maintain the same polytype (in this example, the polytype 4H).

In order to grow a SiC single crystal with no other polytypes mixed therein, the degree of C supersaturation in the Si—C solution 7 shall be kept not more than a specified level. The degree of C supersaturation is defined by the following formula.

(Degree of C supersaturation $\sigma$)=[(C concentration in Si—C solution)−(C equilibrium concentration in Si—C solution)]/(C equilibrium concentration in Si—C solution at the start of crystal growth)

Figure 2:
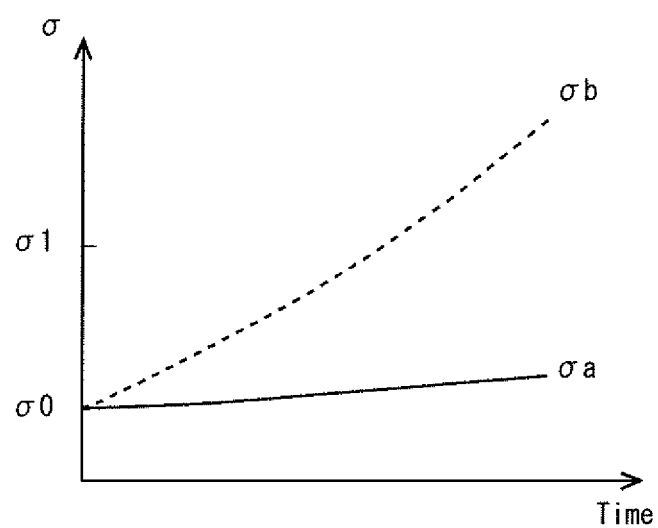
FIG. 2 is a graph showing the relationship between crystal growth time and degree of C supersaturation in a Si—C solution during crystal growth.

FIG. 2 is a graph showing changes in the degree of C supersaturation in the Si—C solution 7 during crystal growth. The vertical axis indicates the degree of C supersaturation $\sigma$, and the horizontal axis indicates time. In FIG. 2, $\sigma 0$ denotes the degree of C supersaturation at the start of crystal growth. The reference symbol of denotes the critical degree of C supersaturation that causes formation of other polytypes. In other words, when the degree of C supersaturation $\sigma$ becomes $\sigma 1$ or more, polycrystals are formed and deposited on the crystal growth surface 8S and on the inside wall of the crucible 5.

The dashed line in FIG. 2 shows a case of an existing (conventional) production method, that is, shows changes in the degree of C supersaturation $\sigma b$ in the Si—C solution 7 in a case where the crystal growth temperature is kept constant during a growth step. The solid line in FIG. 2 shows a case of the production method according to the present embodiment, that is, shows changes in the degree of C supersaturation $\sigma a$ in the Si—C solution 7 in a case where the crystal growth temperature is raised as time passes during a growth step.

Referring to FIG. 2, in the case of a conventional production method (see the dashed line $\sigma b$), as described above, the degree of C supersaturation $\sigma b$ rises as time passes. In this case, during the growth step, after the lapse of time t, the degree of C supersaturation $\sigma b$ rises above $\sigma 1$. Accordingly, polytypes other than 4H are likely to be formed.

In the case of the production method according to the present embodiment (see the solid line $\sigma a$), however, the rise of the degree of C supersaturation with a lapse of time is suppressed. The higher the crystal growth temperature is, the higher the C solubility is. Accordingly, the C solubility during crystal growth in the case of σa is higher than that in the case of σb. Thereby, in the case of σa, the rise of the degree of C supersaturation in the Si—C solution 7 is suppressed. Thus, by rising the crystal growth temperature with a lapse of time during crystal growth, it is possible to prevent the degree of C supersaturation from rising excessively, and it is possible to keep the degree of C supersaturation within a proper range. This prevents formation of other polytypes and helps in maintaining the spiral growth of a 4H—SiC single crystal, and therefore, it becomes possible to produce a 4H—SiC single crystal of high purity.

As described above, the degree of C supersaturation in the Si—C solution 7 becomes higher as time passes. In order to suppress the rise of the degree of C supersaturation, the C solubility in the Si—C solution 7 is preferably adjusted to become higher as time passes. In other words, the crystal growth temperature is preferably adjusted to be higher at the end of growth of a SiC single crystal than at the start of the crystal growth. Additionally, the temperature of the Si—C solution 7 is preferably raised at a constant rate. In this case, the output control of the induction heater 3 is easy.

The rate of temperature rise of the Si—C solution 7 during the growth step is preferably 1 to 10° C./h. When the rate of temperature rise is lower than 1° C./h, the rise of the degree of C supersaturation is not sufficiently suppressed, and other polytypes may be formed. When the rate of temperature rise is higher than 10° C./h, the Si—C solution 7 becomes unsaturated with C, and the grown SiC single crystal may be dissolved. Therefore, the rate of temperature rise is desirably 1 to 10° C./h. More desirably, the lower limit of the rate of temperature rise is higher than 1° C./h, still more desirably, equal to or higher than 1.2° C./h, and further still more desirably, equal to or higher than 1.5° C./h. The upper limit of the rate of temperature rise is more desirably lower than 10° C./h, still more desirably, equal to or lower than 9° C./h, and further still more desirably, equal to or lower than 5° C./h.

The lower limit of the crystal growth temperature of the Si—C solution 7 at the start of crystal growth is desirably 1800° C. When the crystal growth temperature is below 1800° C., the crystal growth of 4H—SiC becomes unstable, and other polytypes may be formed. The upper limit of the crystal growth temperature of the Si—C solution 7 at the end of crystal growth is desirably 2200° C. When the crystal growth temperature is above 2200° C., especially under the atmospheric pressure, the Si—C solution 7 may be significantly evaporated. The upper limit of the crystal growth temperature at the end of crystal growth is more desirably 2100° C. The lower limit of the crystal growth temperature at the end of crystal growth is desirably 1850° C., and more desirably, 1900° C.

It is preferred that a meniscus is formed in the growth step between the crystal growth surface 8S of the SiC seed crystal 8 and the liquid surface of the Si—C solution 7. When a meniscus is formed, formation of other SiC polytypes on the crystal growth surface 8S are suppressed.

The height of the meniscus is preferably not more than 3 mm. When the height of the meniscus is more than 3 mm, the meniscus becomes slender, and the diameter of the grown SiC single crystal becomes smaller. When the meniscus becomes slender, the degree of C supersaturation in vicinity to the crystal growth surface 8S becomes higher. Accordingly, different polytypes may be formed and mixed in, and SiC polycrystals may be generated.

The growth step may include a melt-back step. In the melt-back step, the crystal growth temperature is raised to cause the Si—C solution 7 to be unsaturated with C. Thereafter, the crystal growth surface 8S of the SiC seed crystal 8 is brought into contact with the Si—C solution 7. Then, the contact portion of the SiC seed crystal 8 that is in contact with the Si—C solution 7 is dissolved. In this way, a possible damaged layer that was formed on the crystal growth surface 8S of the SiC seed crystal 8 by any processing, defects on and around the crystal growth surface 8S and the like can be removed.

According to the above description of the production method, the temperature of the Si—C solution 7 is raised at a constant rate. However, the rate of temperature rise need not be constant. The temperature rise may be controlled in response to the degree of C supersaturation in the Si—C solution 7.

The crystal growth surface is preferably a c-plane of the SiC single crystal, that is, the (0001) plane or the (000-1) plane. In this case, since the crystal growth surface is flat, it is easy to maintain the 4H—SiC polytype by spiral growth.

Second Embodiment

In a second embodiment, a SiC single crystal produced by the production method according to the first embodiment is used as a seed crystal in a production process of another SiC single crystal. The production method according to the second embodiment employs a sublimation-recrystallization technique or a high-temperature CVD technique, for example.

In cases of employing the sublimation-recrystallization technique or a high-temperature CVD technique, the growth rate of a SiC single crystal is high, as compared with cases of employing the solution growth technique. Therefore, a SiC single crystal of a desired size can be produced speedily.

In a production process employing the sublimation-recrystallization technique or the high-temperature CVD technique, however, if the SiC seed crystal includes different polytypes, the produced SiC single crystal is likely to include different polytypes. Therefore, it is preferred that a SiC single crystal produced by the production method according to the first embodiment is used as the seed crystal in the production process employing the sublimation-recrystallization technique or the like. This prevents formation of other polytypes and occurrence of crystal defects in a SiC single crystal even when the SiC single crystal is produced by the sublimation-recrystallization technique or the like.

In the above embodiments, production of a 4H—SiC single crystal has been described. The polytype of a SiC single crystal to be produced by the production methods according to the embodiments is not limited to 4H—SiC. The production methods according to the embodiments are applicable to production of a SiC single crystal of 6H, 3C or any other polytype. In such cases also, it is possible to produce a SiC single crystal hardly including other polytypes.

EXAMPLES

SiC single crystals were produced by different production methods under various growth conditions. In any of the production methods, a 4H—SiC single crystal was used as the SiC seed crystal. Then, the produced SiC single crystals underwent examinations of polytype and crystal quality. TABLE 1 shows the growth conditions in the experiment.

TABLE 1

|  | Inventive Example 1 | Inventive Example 2 | Inventive Example 3 | Comparative Example 1 |
|---|---|---|---|---|
| Growth Time [h] | 5 | 20 | 20 | 5 |
| Temperature at Start of Growth [° C.] | 1948 | 1897 | 1897 | 1948 |
| Temperature at End of Growth [° C.] | 2004 | 1952 | 1952 | 1948 |
| Rate of Temperature Rise [° C./h] | 11.2 | 2.75 | 2.75 | 0 |
| Growth Thickness [μm] | 298 | 3309 | 3797 | 253 |
| Rate of Growth [μm/h] | 60 | 165 | 190 | 51 |
| Height of Meniscus [mm] | 2 | 2 | 4 | 2 |
| Crystal Structure | G | G | G | NA |
| Crystal Defect | G | G | NA | G |

In Inventive Examples 1 to 3, the temperature of the Si—C solution was being raised during the growth step. In Comparative Example 1, the temperature of the Si—C solution was kept constant. In Inventive Example 3, the height of the meniscus was greater as compared with those in Inventive Examples 1, 2 and Comparative Example 1. The Si—C solutions used in Inventive Examples 1 to 3 and Comparative Example 1 had the same composition.

[Growth Time]

The growth time indicates the time period from the start to the end of growth of a SiC single crystal. In Inventive Example 1 and Comparative Example 1, the growth time was 5 hours. In Inventive Examples 2 and 3, the growth time was 20 hours.

[Temperature at Start of Growth and Temperature at End of Growth]

The temperature at start of growth indicates the crystal growth temperature at the start of growth of a SiC single crystal. The temperature at end of growth indicates the crystal growth temperature at the end of growth of a SiC single crystal.

[Rate of Temperature Rise]

The rate of temperature rise indicates the temperature rise of the Si—C solution per hour. The rate of temperature rise was 11.2° C./h in Inventive Example 1, and 2.75° C./h in Inventive Examples 2 and 3. In Comparative Example 1, the temperature of the Si—C solution was not raised.

[Growth Thickness]

The growth thickness indicates the thickness of the produced SiC single crystal. In other words, the growth thickness indicates the distance between the crystal growth surface of the SiC seed crystal and the crystal growth surface of the produced SiC single crystal.

[Rate of Growth]

The rate of growth indicates the growth thickness of the SiC single crystal per hour.

[Height of Meniscus]

The height of meniscus indicates the distance between the crystal growth surface of the SiC single crystal and the liquid surface of the Si—C solution during the growth step. The positions of the crystal growth surface and the liquid surface of the Si—C solution change as time passes. In the present embodiment, the seed shaft and the crucible were moved relative to each other so that the height of the meniscus could be kept constant. In Inventive Examples 1, 2 and Comparative Example 1, the height of meniscus was 2 mm. In Inventive Example 3, the height of meniscus was 4 mm.

[Polytype]

The crystal growth surface of each of the produced SiC single crystals was observed with an optical microscope. When a 4H—SiC single crystal was seen entirely on the crystal growth surface, it was evaluated as "G" (good). When a 4H—SiC single crystal was seen not entirely on the crystal growth surface or when any defect was seen in the produced SiC single crystal, it was evaluated as "NA" (not acceptable).

[Crystal Defect]

Each of the produced SiC single crystal was cut, and the cut surface was observed with an optical microscope. When no defects were seen in the inside of the crystal, it was evaluated as "G" (good). When any defect was seen in the inside of the crystal, it was evaluated as "NA" (not acceptable).

Figure 3:
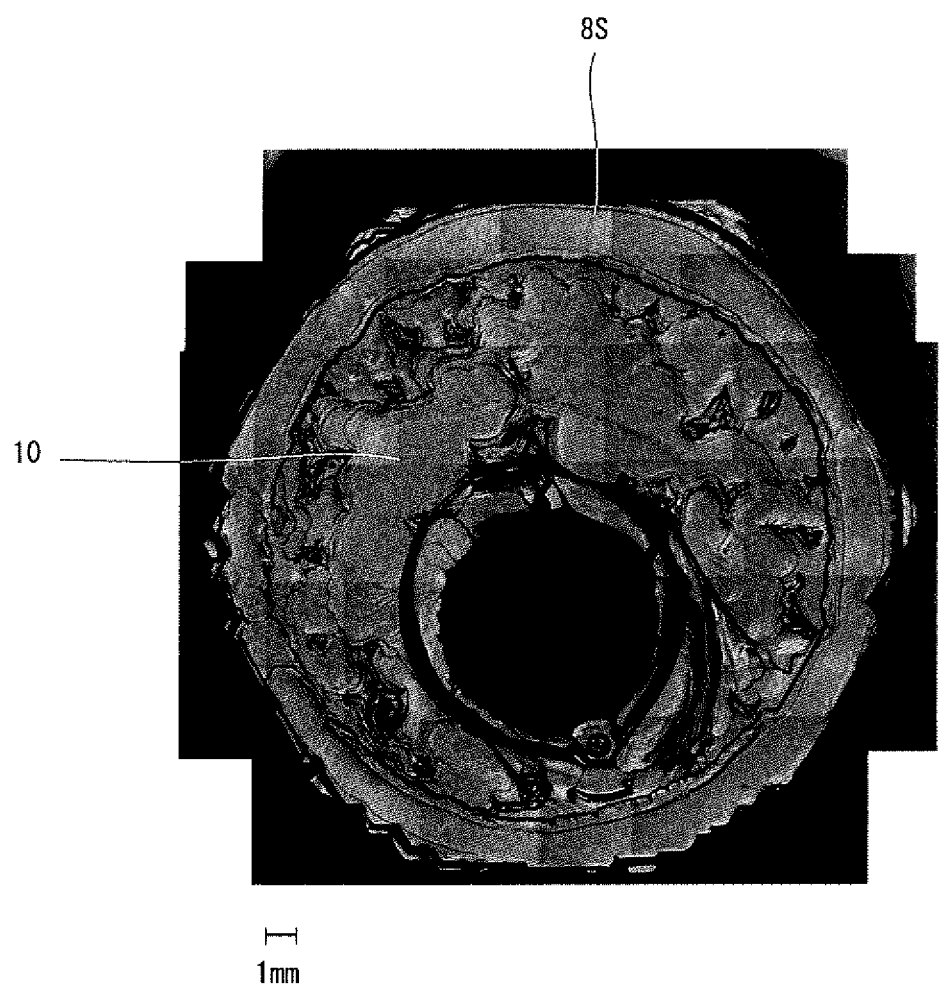
FIG. 3 is an image showing the morphology of the crystal growth surface of a SiC single crystal produced as a first inventive example.
Figure 4:
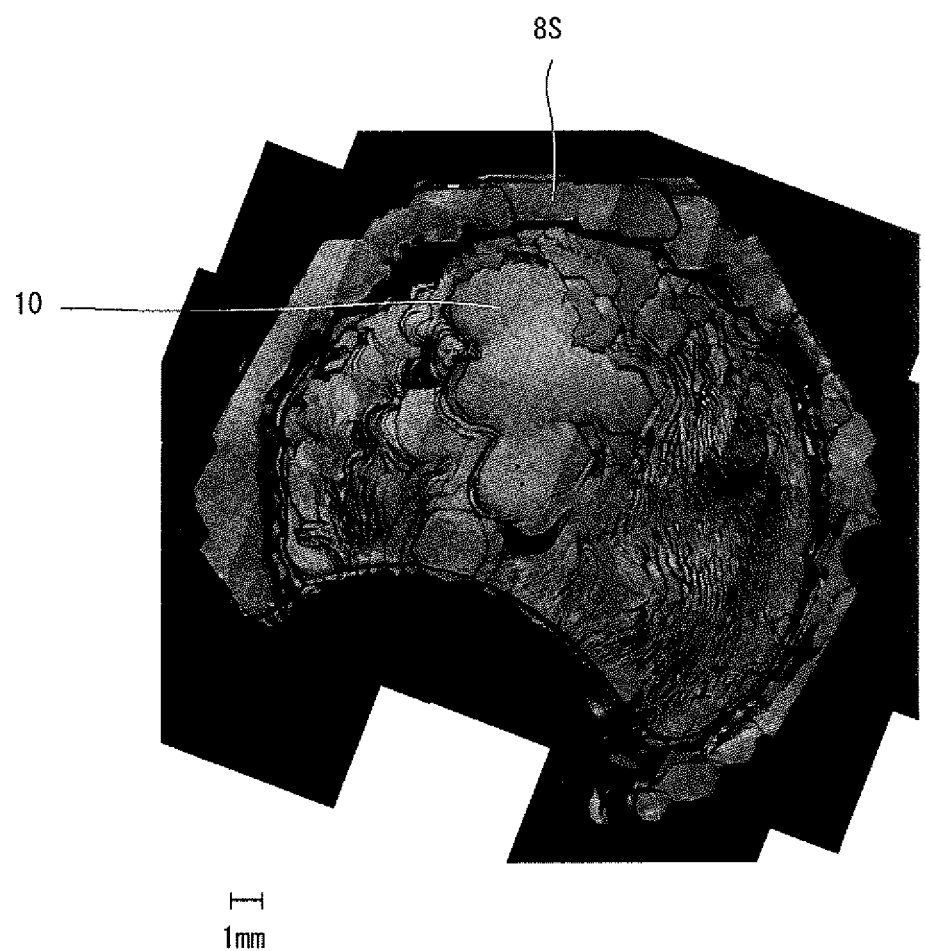
FIG. 4 is an image showing the morphology of the crystal growth surface of a SiC single crystal produced as a first comparative example.

FIG. 3 is an image showing the morphology of the crystal growth surface 8S of the SiC single crystal of Inventive Example 1. Specifically, the crystal growth surface 8S was photographed by a differential interference optical microscope. FIG. 4, which will be described later, is an image showing morphology that was obtained by photographing the crystal growth surface 8S in the same manner. In FIG. 3, a morphology including island shaped parts is seen entirely on the crystal growth surface 8S. A screw dislocation exists in the center of each of the island shaped parts, and spiral growth on the entire crystal growth surface 8S was confirmed. In other words, it was confirmed that spiral growth of a 4H—SiC single crystal was continuously progressed with the polytype of the 4H—SiC single crystal inherited. Progression of spiral growth of a 4H—SiC single crystal was confirmed in Inventive Examples 2 and 3 as well as in Inventive Example 1.

FIG. 4 is an image showing the morphology of the crystal growth surface 8S of a SiC single crystal of Comparative Example 1. In FIG. 4, island shaped parts are seen not entirely on the crystal growth surface 8S. This confirms that spiral growth of a crystal was not maintained in some regions of the crystal growth surface 8S. Therefore, other polytypes may be mixed in the SiC single crystal as the crystal growth is further progressed.

Next, each of the SiC single crystals produced as the examples was cut, and the inside thereof was observed.

In Inventive Examples 1, 2 and Comparative Example 1, no defects were seen in the inside of the SiC single crystal. The SiC single crystal of Inventive Example 3 was a 4H—SiC single crystal. However, in the SiC single crystal, voids penetrating to the inside thereof were seen. Therefore, the SiC single crystal of Inventive Example 3 was evaluated as a crystal having defects.

In Inventive Examples 2 and 3, the rate of temperature rise was 2.75° C./h, that is, equal to or lower than 10 CC/h. In Inventive Examples 2 and 3, it is thought that the Si—C solution was kept supersaturated with C during crystal growth. For this reason, in Inventive Examples 2 and 3, the growth rate of the SiC single crystal was higher than the growth rate in Inventive Example 1, in which the rate of temperature rise was higher than 10° C./h.

Some embodiments of the present invention have been described. However, the above embodiments are merely examples to show how to carry out the present invention. The present invention is not limited to the above-described embodiments, and it is possible to carry out the present invention by modifying the above-described embodiments as appropriate without departing from the gist of the invention.

LIST OF REFERENCE SYMBOLS

1: production apparatus
7: Si—C solution
8: SiC seed crystal
8S: crystal growth surface

The invention claimed is:

1. A method for producing a SIC single crystal by a solution growth technique, the method comprising:
   a formation step of forming a Si—C solution by melting material for the Si—C solution contained in a crucible; and
   a growth step of bringing a SiC seed crystal attached to a bottom end of a seed shaft into contact with the Si—C solution and growing a SiC single crystal on a crystal growth surface of the SiC seed crystal, wherein
   in the growth step, while a temperature of the Si—C solution is being raised, the SiC single crystal is grown.

2. The method for producing a SiC single crystal according to claim 1, wherein
   in the growth step, a crystal growth temperature at the end of growth of the SiC single crystal is higher than a crystal growth temperature at the start of growth of the SiC single crystal.

3. The method for producing a SiC single crystal according to claim 1, wherein
   in the growth step, a meniscus is formed between a liquid surface of the Si—C solution and the crystal growth surface of the SIC seed crystal.

4. The method for producing a SiC single crystal according to claim 3, wherein
   the meniscus has a height of 3 mm or less.

5. A method for producing a SIC single crystal, the method comprising:
   a formation step of forming a Si—C solution by melting material for the Si—C solution contained in a crucible,
   a first growth step of bringing a first SiC seed crystal attached to a bottom end of a seed shaft into contact with the Si—C solution and growing a first SIC single crystal on a crystal growth surface of the first SiC seed crystal, wherein
   in the first growth step, while a temperature of the Si—C solution is being raised, the first SiC single crystal is grown,
   a preparation step of preparing the first SIC single crystal; and
   a second growth step of using the first SiC single crystal as a second seed crystal and growing a second SiC single crystal on a crystal growth surface of the second SiC seed crystal by a sublimation-recrystallization technique or a high-temperature CVD technique.

6. The method for producing a SiC single crystal according to claim 2, wherein
   in the growth step, a meniscus is formed between a liquid surface of the Si—C solution and the crystal growth surface of the SiC seed crystal.

7. The method for producing a SiC single crystal according to claim 6, wherein
   the meniscus has a height of 3 mm or less.

8. The method for producing a SiC single crystal according to claim 5, wherein
   in the first growth step, a crystal growth temperature at the end of growth of the first SiC single crystal is higher than a crystal growth temperature at the start of growth of the first SiC single crystal.

9. The method for producing a SiC single crystal according to claim 5, wherein
   in the first growth step, a meniscus is formed between a liquid surface of the Si—C solution and the crystal growth surface of the first SIC seed crystal.

10. The method for producing a SiC single crystal according to claim 8, wherein
    in the first growth step, a meniscus is formed between a liquid surface of the Si—C solution and the crystal growth surface of the first SIC seed crystal.

11. The method for producing a SiC single crystal according to claim 9, wherein
    the meniscus has a height of 3 mm or less.

12. The method for producing a SiC single crystal according to claim 10, wherein
    the meniscus has a height of 3 mm or less.

* * * * *